(12) United States Patent
Muth (10) Patent No.: US 11,755,524 B2
(45) Date of Patent: Sep. 12, 2023

(54) CONTROLLER AREA NETWORK APPARATUS

(71) Applicant: NXP B.V., Eindhoven (NL)

(72) Inventor: Matthias Berthold Muth, Stelle (DE)

(73) Assignee: NXP B.V., Eindhoven (NL)

( * ) Notice: Subject to any disclaimer, the term of this patent is extended or adjusted under 35 U.S.C. 154(b) by 365 days.

(21) Appl. No.: 17/302,752

(22) Filed: May 11, 2021

(65) Prior Publication Data

US 2021/0389972 A1 Dec. 16, 2021

(30) Foreign Application Priority Data

Jun. 15, 2020 (EP) .................................... 20180102
Sep. 15, 2020 (EP) .................................... 20196322

(51) Int. Cl.
| | |
|---|---|
| *H03M 5/06* | (2006.01) |
| *G06F 13/40* | (2006.01) |
| *H03M 5/14* | (2006.01) |
| *H04L 12/40* | (2006.01) |
| *H03M 5/20* | (2006.01) |
| *H03M 13/33* | (2006.01) |

(52) U.S. Cl.
CPC ........ *G06F 13/4072* (2013.01); *H03M 5/145* (2013.01); *H03M 5/20* (2013.01); *H03M 13/33* (2013.01); *H04L 2012/40215* (2013.01)

(58) Field of Classification Search
CPC ........ H03M 1/066; H03M 1/66; H03M 1/742; H03M 13/33; H03M 13/41; H03M 3/348; H03M 3/382; H03M 3/424; H03M 3/454; H03M 3/464; H03M 5/12; H03M 5/20; H04L 7/033; H04L 25/4904; H04L 25/4917; H04L 69/03; H04L 7/0338; H04L 7/0087; H04L 69/324; H04L 7/027; H04L 7/0331; H04L 1/0061; H04L 25/0272; H04L 7/0337; H04L 7/0083; H04L 7/007; H04L 7/0062; H04L 7/0058; H04L 7/0041; H04L 7/0025; H04L 7/0008; H04L 7/0066
USPC ...................................................... 341/67, 68
See application file for complete search history.

(56) References Cited

U.S. PATENT DOCUMENTS

| | | | | |
|---|---|---|---|---|
| 5,594,763 | A * | 1/1997 | Nimishakavi | H04L 7/0331 375/376 |
| 6,385,257 | B1 * | 5/2002 | Tobita | G11B 7/128 |
| 6,760,389 | B1 * | 7/2004 | Mukherjee | H03L 7/18 375/326 |
| 11,368,330 | B2 * | 6/2022 | de Haas | H04L 12/40169 |
| 2004/0078737 | A1 * | 4/2004 | Miyamoto | H04L 7/043 714/700 |

(Continued)

OTHER PUBLICATIONS

Technical Data—MCAN Control register (CCNTRL), p. 68, Freescale Semiconductor, Inc.

*Primary Examiner* — Linh V Nguyen (57) ABSTRACT

A Controller Area Network, CAN, bit stream sampling apparatus for a CAN controller, the apparatus configured to receive a bit stream from a CAN transceiver, the apparatus configured to:
   detect rising edges in said bit stream;
   detect, separately, falling edges in said bit stream; and
   generate a restored non-return-to-zero coded bit stream based at least on said detected falling edges and said detected rising edges.

14 Claims, 4 Drawing Sheets

(56) References Cited

U.S. PATENT DOCUMENTS

| | | | | |
|---|---|---|---|---|
| 2006/0190851 A1* | 8/2006 | Karaki | ............... | G06F 30/35 |
| | | | | 716/106 |
| 2006/0250192 A1* | 11/2006 | Hsieh | ............... | H03L 7/113 |
| | | | | 331/16 |
| 2009/0268824 A1* | 10/2009 | Fukuda | ............... | H04L 25/4904 |
| | | | | 375/244 |
| 2010/0142976 A1* | 6/2010 | Uemura | ............... | H04B 10/801 |
| | | | | 398/183 |
| 2011/0038428 A1* | 2/2011 | Fukuda | ............... | H04B 3/548 |
| | | | | 375/259 |
| 2014/0016654 A1 | 1/2014 | Masataka | | |
| 2014/0355724 A1* | 12/2014 | Hayakawa | ............... | H04L 7/046 |
| | | | | 375/342 |
| 2016/0196230 A1* | 7/2016 | Pihet | ............... | G06F 13/4027 |
| | | | | 710/314 |

* cited by examiner

CONTROLLER AREA NETWORK APPARATUS

CROSS-REFERENCE TO RELATED APPLICATIONS

This application claims the priority under 35 U.S.C. § 119 of European patent application no. 20180102.4, filed on Jun. 15, 2020, and European patent application no. 20196322.0, filed on Sep. 15, 2020, the contents of which are incorporated by reference herein.

FIELD

The present disclosure relates to a sampling apparatus for use in a Controller Area Network (CAN). In particular, the disclosure relates to a sampling apparatus of a CAN controller and a CAN node including a CAN transceiver and said CAN controller. The present disclosure also relates to a CAN network and method of operating the sampling apparatus.

BACKGROUND

CAN networks provide communication between nodes over a bus. Nodes that are connected to the bus can transmit data to and receive data from other nodes that are connected to the bus. A CAN node typically comprises a CAN controller and a CAN transceiver for coupling to the CAN bus. The CAN transceiver provides differential signaling to the bus based on digital transmit data from the CAN controller and receives differential signaling from the bus and provides a bit stream comprising receive data to the CAN controller. A CAN network implements the CAN protocol which defines rules for the communication between the nodes.

SUMMARY

According to a first aspect of the present disclosure there is provided a Controller Area Network, CAN, bit stream sampling apparatus for a CAN controller, the apparatus configured to receive a bit stream from a CAN transceiver, the apparatus configured to:
  detect rising edges in said bit stream;
  detect, separately, falling edges in said bit stream; and
  generate a restored non-return-to-zero coded bit stream based at least on said detected falling edges and said detected rising edges.

In one or more examples, a first block configured to provide for said detection of said rising edges in said bit stream; a second block configured to provide for said detection of said falling edges in said bit stream; and a selector block configured to provide for generation of the restored non-return-to-zero coded bit stream based on said detection of the rising edges and falling edges in said bit stream by said first block and said second block;
  wherein detection of a rising edge by the first block provides for generation of a first logic state bit in said restored non-return-to-zero coded bit stream, and detection of a falling edge by the second block provides for generation of a second logic state bit in said restored non-return-to-zero coded bit stream.

It will be appreciated that the first logic state bit may comprise a logic high bit and the second logic state bit may comprise a logic low bit. However, the assignment between the edge transitions and the logical state is arbitrarily assigned depending on the protocol.

In one or more examples, the said first block is configured to provide for generation of a further first logic state bit in said restored non-return-to-zero coded bit stream subsequent to said first logic bit generated following the detection of the rising edge and prior to detection of a directly subsequent edge based on the elapse of a predetermined bit time; and
  said second block is configured to provide for generation of a further second logic bit in said restored non-return-to-zero coded bit stream subsequent to said second logic state bit generated following the detection of the falling edge and prior to detection of a directly subsequent edge based on the elapse of the predetermined bit time.

In one or more examples, the said first block is configured to provide an edge detect signal on detection of a rising edge to the selector block to instruct the selector block to generate the first logic state bit in the restored non-return-to-zero coded bit stream and the first block is configured to provide a bit elapsed signal after each predetermined bit time that follows to enable the selector block to generate one or more subsequent first logic state bits in the restored non-return-to-zero coded bit stream; and
  wherein said second block is configured to provide an edge detect signal on detection of a falling edge to the selector block to instruct the selector block to generate the second logic state bit in the restored non-return-to-zero coded bit stream and the second block is configured to provide a bit elapsed signal after each predetermined bit time that follows to enable the selector block to generate one or more subsequent second logic state bits in the restored non-return-to-zero coded bit stream.

In one or more examples, said first block and said second block are configured to determine a nominal bit time of said bit stream, said nominal bit time comprising the time for which a bit is transmitted by a transmitting node that transmits said bit stream, wherein said first block is configured to determine said nominal bit time based on a determined first block time between rising edges of said bit stream, and said second block is configured to determine said nominal bit time based on a determined second block time between falling edges of said bit stream, wherein said first block time and said second block time are indicative of an integer multiple of the nominal bit time of said bit stream; and
  said first block and/or said second block are configured to provide for modification of said predetermined bit time based on said determined nominal bit time.

In one or more examples, said first block time comprises the time between consecutive rising edges.

In one or more examples, said second block time comprises the time between consecutive falling edges.

In one or more examples, said first block and said second block are configured to receive a clock signal from an oscillator and wherein said predetermined bit time is defined by a number of cycles of said oscillator. The number of cycles defining the predetermined bit time may be modified so that the predetermined bit time conforms to said determined nominal bit time.

In one or more examples, the apparatus is configured to reject noise in said bit stream by oversampling the bit stream and detecting a rising edge based on a change in logic state to the first logic state between two samples and said first logic state being maintained in at least a third sample, consecutive with said first and said second sample, and
  detecting a falling edge based on a change in logic state to the second logic between two samples and said second logic state being maintained in at least a third sample, consecutive with said first and said second sample.

In one or more examples, the apparatus is configured to use oversampling on said bit stream to reject noise, said oversampling comprising sampling the bit stream using at least two consecutive samples, wherein based on a rising or falling edge determined by said first sample and the other of a rising or falling edge determined by said second sample, the determined edges in the bit stream are rejected as noise, wherein said samples are taken with a time spacing less than a threshold.

In one or more examples, said threshold is a time spacing less than the bit time.

In one or more examples, the first block is configured to, on detection of a rising edge, provide a synchronisation signal to the second block to define a time point from which the elapse of the predetermined time period is determined; and wherein the second block is configured to, on detection of a falling edge, provide a synchronisation signal to the first block to define a time point from which the elapse of the predetermined time period is determined.

According to a second aspect of the present disclosure we provide a CAN controller including the CAN bit stream sampling apparatus of the first aspect. The CAN controller may be configured to couple to a CAN transceiver to receive the bit stream and to provide transmit data for transmission in the CAN bus. The CAN controller may include a CAN protocol controller that implements the CAN protocol.

According to a third aspect of the present disclosure we provide a CAN network including a plurality of nodes, wherein at least one of said nodes includes the CAN controller of the second aspect.

According to a fourth aspect of the present disclosure we provide a method of sampling a bit stream in a CAN controller, the method comprising receiving a bit stream from a CAN transceiver;
   detecting rising edges in said bit stream;
   detecting, separately, falling edges in said bit stream; and
   generating a restored non-return-to-zero coded bit stream based at least on said detected falling edges and said detected rising edges.

In one or more examples, said detecting a rising edge provides for a first logic state in said generating of the restored non-return-to-zero coded bit stream; and said detecting a falling edge provides for a second logic state in said generating of the restored non-return-to-zero coded bit stream, and wherein the method includes determining a nominal bit time, said nominal bit time comprising the time for which a bit is transmitted by a transmitting node that transmits said bit stream, wherein said nominal bit time is for use as the bit length of the restored non-return-to-zero coded bit stream, said determination of the nominal bit time based on a determined time between consecutive rising edges of said bit stream and/or based on a determined time between consecutive falling edges of said bit stream.

In a further aspect, we provide a CAN sampling mechanism, in particular CAN XL sampling mechanism, on the RXD path which detects falling and rising edges separately and uses the edge information to restore the NRZ coded bit stream inside the CAN controller, in particular the CAN XL controller In a further aspect or in one or more examples, we provide a CAN sampling mechanism, in particular CAN XL sampling mechanism, on the RXD path, which uses optionally some oversampling (like 2 samples in a row or more) to reject noise of very fast edges in a row, at minimum it uses single samples to detect edge transitions. The amount of multiple edges may be programmable to define the filter characteristics rejecting noise pulses.

In a further aspect or in one or more examples, we provide a CAN sampling mechanism, in particular CAN XL sampling mechanism, on RXD, which synchronizers both edge monitors based on detection of an edge on a single edge monitor. Actually, if a falling edge is detected, both edge detectors are correcting their bit timing with the same amount of time shift to compensate for oscillator tolerances between the sending and the receiving node.

In a further aspect or in one or more examples, we provide a CAN controller, in particular CAN FD controller, making use of the same sampling mechanism on the RXD line during the fast data phase.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

BRIEF DESCRIPTION OF THE DRAWINGS

One or more embodiments will now be described by way of example only with reference to the accompanying drawings in which.

DETAILED DESCRIPTION

A Controller Area Network, CAN, typically comprises a plurality of nodes each connected to a two wire CAN bus.

The nodes can communicate with each other by sending and receiving signaling to and from the CAN bus.

Figure 1:
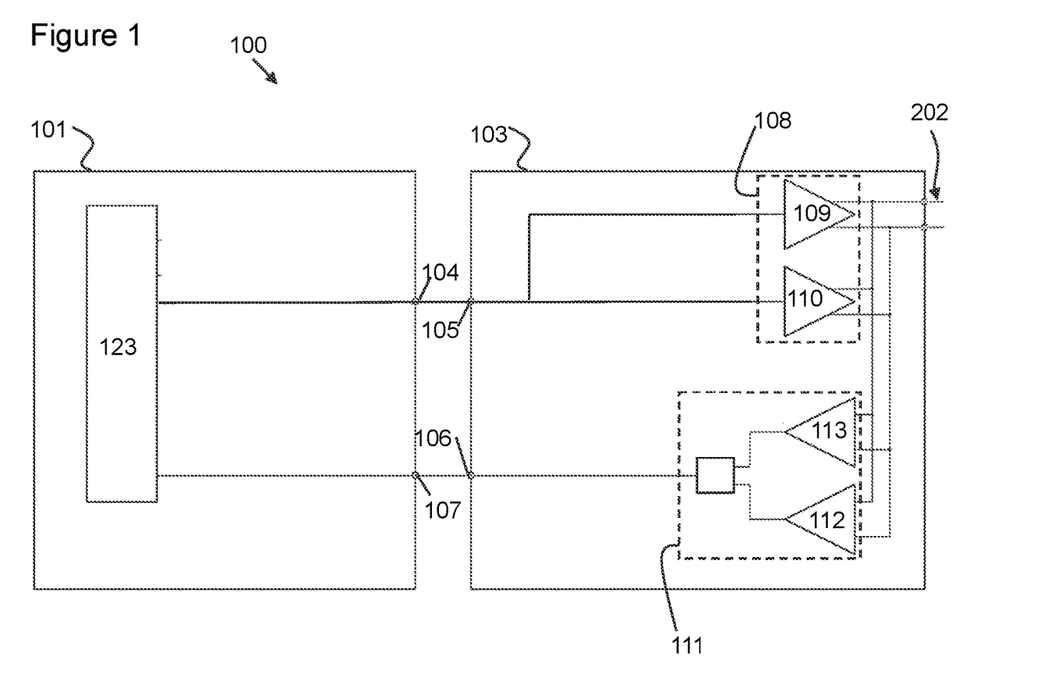
FIG. 1 shows an example embodiment of a CAN controller coupled with a CAN transceiver.
Figure 2:
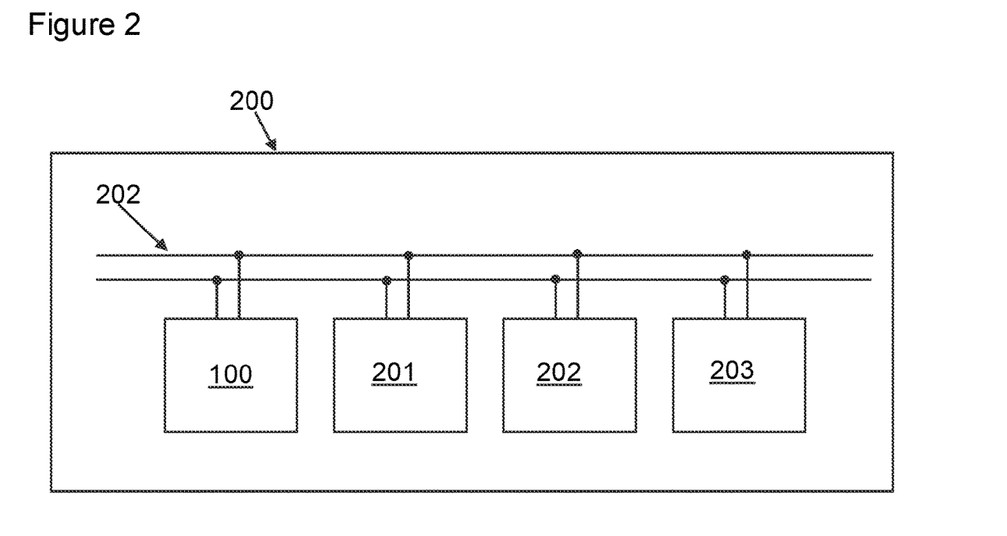
FIG. 2 shows an example CAN network.

FIG. 1 shows an example node 100. FIG. 2 shows an example Controller Area Network 200 comprising a plurality of nodes including node 100 and other nodes 201, 202, 203. The network 200 may be part of an automobile or other apparatus and the CAN network may provide for communication between systems of the automobile or the other apparatus. The network includes a two wire CAN bus 202 to which the nodes 100, 201, 202, 203 are coupled. It will be appreciated that the network 200 may comprise any number of nodes and may also include termination nodes at each end of the bus 202 to provide a predetermined resistance between the bus wires.

Returning to FIG. 1 there is shown an example node 100. The node includes a CAN controller 101, such as a microcontroller. The CAN controller 101 may have the CAN protocol embedded therein, such as in a protocol controller module. The CAN controller 101 provides and receives signaling from the CAN bus 202 using a CAN transceiver 103. The CAN transceiver 103 therefore typically provides signaling to the CAN bus based on transmit data received from the CAN controller 101 and provides receive data to the CAN controller 101 based on signaling it receives from the CAN bus 102. The CAN transceiver 103 may be configured to provide the signaling to the CAN bus 102 with the appropriate voltage levels for logic high and logic low based on the transmit data and with the appropriate differential signaling for the two-wire CAN bus according to the CAN protocol. The CAN transceiver 103 may be configured to generate the receive data for the CAN controller by converting the differential signaling of the bus to a bit stream on a single receive line or RXD for the CAN controller.

Reference to a CAN transceiver or a CAN controller herein may be understood as a controller and transceiver that implements, at least in part, the CAN protocol in full or in part or the CAN FD protocol in full or in part. The functionality described for the CAN transceiver or CAN controller herein may comprise increased functionality above what is currently defined in the CAN or CAN FD protocol specification, such as in the proposed CAN XL protocol specification.

The CAN controller 101 is configured to provide transmit data at a transmit output 104 for receipt at a transmit input 105 of the CAN transceiver 103. The transmit output 104 and transmit input 105 (also known as "TXD") may comprise integrated circuit pins. Thus, the transmit input pin 105 is configured to receive transmit data from the CAN controller 101. The CAN transceiver 103 is configured to receive signaling from the CAN bus 102 and provide received data based on the signaling to a receive output 106 for receipt at a receive input 107 at the CAN controller 101. The receive output 106 and the receive input 107 may comprise integrated circuit pins. The receive output 106 and the receive input 107 are also known as "RXD" in the art.

The CAN transceiver 103 comprises a transmitter arrangement 108 configured to transmit signaling on the CAN bus 102 based on said transmit data. The CAN transceiver 103 also comprises a receiver arrangement 111 configured to receive signaling from the CAN bus 102 and provide received data based on the signaling.

The transmitter arrangement 108 comprises at least one transmitter and, in this example comprises two transmitters 109, 110. The at least one transmitter is configured to operate in a first transmission mode or a second transmission mode, wherein in the first transmission mode the transmitter arrangement is configured to transmit said signaling with a first property and wherein in the second transmission mode the transmitter arrangement is configured to transmit said signaling with a second property. The first and second property may comprise one or more property types, such as baud rate (e.g. maximum, minimum or average baud rate), voltage level scheme, encoding scheme or other. However, for ease of explanation herein, the first and second property may comprise baud rate such that the first property comprises a first baud rate and the second property comprises a second baud rate wherein the second baud rate is higher than the first baud rate. The use of a higher baud rate may improve the rate with which data can be transmitted on the CAN bus. Nevertheless, it will be appreciated that the first and second property could (in any of the example embodiments herein) alternatively be, or additionally be, a voltage level scheme used to represent logic 0 and logic 1 on the CAN bus 102. For example, the first property may comprise use of said first baud rate with a first voltage level scheme and the second property may comprise use of said second baud rate with a different, second voltage level scheme.

Therefore, going forward, and as an example only, the first transmission mode may comprise a normal transmission mode and the second transmission mode may comprise a fast transmission mode having a greater baud rate than the normal transmission mode. In one or more examples, the first transmitter 109 may provide said first or normal transmission mode and the second transmitter 110 may provide said second or fast transmission mode.

In one or more examples, the second transmitter 110 or, more generally, the transmitter arrangement 108, may comprise a first transmitter element configured to increase the potential difference between the at least two wires of the bus to a first differential voltage state and a second transmitter element configured to decrease the potential difference between the at least two wires of the bus towards a second differential voltage state. Thus, the transmitter elements are configured to actively drive the bus between the first differential voltage state and the second differential voltage state and vice versa. In a conventional CAN implementation, termination resistors may be used to drain energy from the bus to adopt one of the differential voltage states but in this example configuration, the bus 202 may be driven to both first and second differential voltage states by a transmitter element, which may be embodied as an amplifier.

It will be appreciated that in one or more examples, the transmitter arrangement 108 may comprise one transmitter and one or more of a change in voltage applied thereto, a bias voltage and the switching in or out of additional circuitry may be used to enable the provision of the first transmission mode and the second transmission mode by the single transmitter. In other examples, more than two transmitters may be used to provide the first transmission mode and the second transmission mode.

The receiver arrangement 111 comprises at least one receiver and, in this example comprises two receivers 112, 113. The at least one receiver may be configured to operate in a first receive mode or a second receive mode, wherein in the first receive mode the receiver arrangement 111 is configured to receive signaling from the bus 102 with the first property and in the second receive mode the receiver arrangement 111 is configured to receive signaling from the bus 102 with the second property. As described above, the property may any one or more of baud rate, voltage level scheme, encoding scheme or other.

Therefore, going forward and as an example only, the first receive mode may comprise a normal receive mode and the second receive mode may comprise a fast receive mode, in which signaling having a greater baud rate is configured to be received from the bus.

As mentioned above and as shown in this example, the receiver arrangement 111 comprises a first receiver 112 configured to receive signaling at said normal baud rate and a second receiver 113 configured to receive signaling at the greater baud rate. In one or more examples, the first receiver 112 is configured to receive said signaling with a first voltage level scheme to determine logic high and logic low of the signaling from the CAN bus 102 and the second receiver 113 is configured to receive said signaling with a second voltage level scheme to determine logic high and logic low from the signaling from the CAN bus 102 different to the first voltage level scheme. Thus, the first and second receivers 112, 113 may differ in terms of one or more of the baud rate they are capable of receiving in terms of distinguishing between symbols on the CAN bus 102 and the voltage level scheme used for the signaling on the CAN bus (to enable the receipt of signaling with the first and second property). Each of the receivers 112, 113 have two inputs to receive signaling from the two wire CAN bus 102 and a single output to provide for onward transmission of the received data to the CAN controller 101 or any other components therebetween.

It will be appreciated that in one or more examples, the receiver arrangement 111 may comprise one receiver and one or more of a change in voltage applied thereto, a bias voltage and the switching in or out of additional circuitry may be used to enable the provision of the fast receive mode and slow receive mode by the single receiver. In other examples, more than two receivers may be used to provide the first receive mode and second receiver mode.

The determination of whether it is required for the node 100 to operate in the first transmission mode rather than the second transmission mode may be made by the CAN controller 101.

Turning now to the example configuration of the CAN controller 101, the CAN controller 101 may comprise a controller module 123, which may comprise a CAN protocol controller, and is configured to output the transmit data. The transmit data may be provided to the transmit output 104 for the CAN transceiver. The transmit data may comprise NRZ encoded transmit data (Non-Return-to-Zero, NRZ, encoded) in at least one mode of operation of the CAN controller 101. The signaling received by the receiver arrangement 111 may also be NRZ encoded signaling. The receive data received by the CAN controller 101 at receive input or RXD 107 may also comprise NRZ encoded signaling.

The signaling on the CAN bus 102 may comprise, in accordance with the CAN protocol, logic 0, i.e. dominant according to the CAN protocol provided by (typically) 2V between the wires of the bus, or logic 1, i.e. recessive according to the CAN protocol provided by 0V between the wires of the bus. The CAN protocol defines a predetermined bit time for which each bus level should be provided. In an ideal situation, the dominant and recessive levels (and/or other differential voltage levels that may be provided between the CAN bus wires) may be provided for the predetermined bit times.

Figure 3:
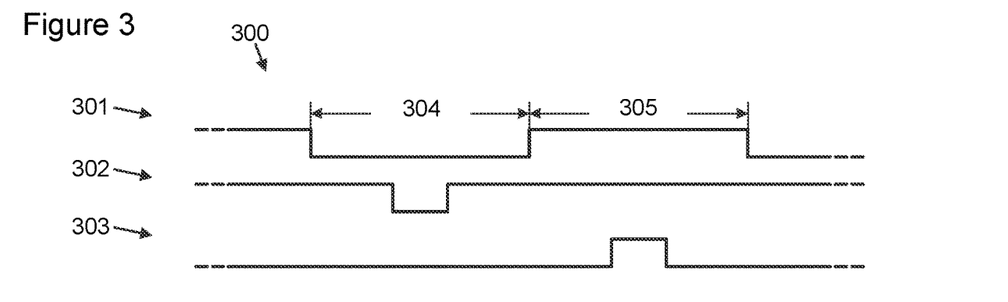
FIG. 3 shows asymmetry examples for a NRZ coded CAN bit stream.

With reference to example FIG. 3, signaling is shown that represents CAN protocol messages, which are provided by the differential bus signaling, and are coded with the NRZ signal scheme on the bus wires. This means that any bit is represented by a dedicated bus level. The NRZ bit coding scheme has been used since the beginning of the CAN protocol in what is known to those skilled in the art as conventional/classical CAN, as well as in CAN FD (Controller Area Network Flexible Data-Rate) and is planned to be used for the next flavour of CAN referred to as "CAN XL" as well.

A generic problem with NRZ coded signals is that these signals suffer from signal distortions, especially regarding bit length variations. Depending on all kinds of physical effects, the bus signaling representing the bits on the bus 102 may get longer on one level (e.g. one of the dominant or recessive levels) while they get shorter on the other level (e.g. the other of the dominant or recessive levels) respectively or vice versa. Thus, the temporal length of a dominant or logic 0 may be increased relative to the predetermined bit time defined by the CAN protocol and the temporal length of a recessive or logic 1 may be decreased relative to the predetermined bit time defined by the CAN protocol. In one or more examples, the "Duty Cycle" or "Asymmetry" of the bit stream may degrade on the transport from a sending node, e.g. 201, 202, 203 towards an e.g., receiving node 100 in the bus 202. Each element on that path, i.e. the nodes 201, 202, 203 between the sending and receiving nodes on the bus 202, may add to such "asymmetry".

FIG. 3 shows a timing diagram 300 illustrating asymmetry examples for a NRZ coded CAN bit stream. Trace 301 shows an ideal bus signal received by a node 100 or any other node 201, 202, 203. The nominal bit length 304 for a logic low bit is the same as the nominal bit length 305 of a subsequent logic high bit. In trace 302, a first "extreme" is shown in which the logic low bit time is short and the logic high bit time is long. Accordingly, the bit times are asymmetric with the logic high state dominating. In trace 303, a second "extreme" is shown in which the logic high bit time is short and the logic low bit time is long. Accordingly, the bit times are asymmetric with the logic low state dominating.

Since nodes 100, 201, 202, 203 in a bus system of CAN have no common clock reference and there is no easy clock recovery possible from an NRZ coded bit stream, as all CAN systems make use of an edge-based resynchronization. If there is an edge detected, this is treated to be a bit change driven by the sending node and a receiving node can take that as a reference time point to re-construct the bits after that based on a local oscillator and knowing the used baud rate by the system configuration. Since local clock sources are never 100% identical, a receiving node over time would drift away from the sending node and would lose the correct bit stream. Therefore, these detected edges can be used for re-synchronization.

In conventional CAN and in CAN FD this re-synchronization is done on a single falling edge (recessive to dominant bit transition, differential bus voltage 0V to, typically, 2V) and only said falling edges are used for re-synchronization. All the following bits are detected, i.e. sampled, based on this falling edge as a reference time point.

In conventional CAN and in CAN FD the actual bit level sampling is configured for the system and allows to filter disturbances and so on. In order to tolerate asymmetries in both directions, the sample point (the time during a bit time in which the voltage of the bus is sampled to determine if a logic high or logic low state is present) has to be configured to be in the middle of the bit time relative to the last detected synchronizing edge. Based on that, asymmetries up to 50% of the bit time may be tolerated in both directions, but not more. If the asymmetry gets bigger than that, the sampling does not lead to correct bit values anymore and the communication is down i.e. detrimentally affected or ineffective.

Side note: Since an NRZ coded signal does not have guaranteed bit edges if e.g. many zeroes or many ones in a row are transmitted, there are so-called "Stuff Bits" inserted into the bit stream at known positions. For conventional CAN and CAN FD this is done every five consecutive bits with the same level. With that, there are synchronizing edges in such NRZ coded scheme latest after 10 bit times.

Since in real systems and especially for further developments of CAN, such as the proposed CAN XL specification (and CAN FD and Classical CAN), the structural asymmetry may get higher than the tolerable 50% of the bit time, and it is proposed to change the sampling mechanism of an incoming bit stream to the CAN controller 101 on the RXD i.e. the bitstream received at the receive input 107.

In one or more examples, the idea can be transported to CAN FD as well for the phase without Arbitration.

Figure 4:
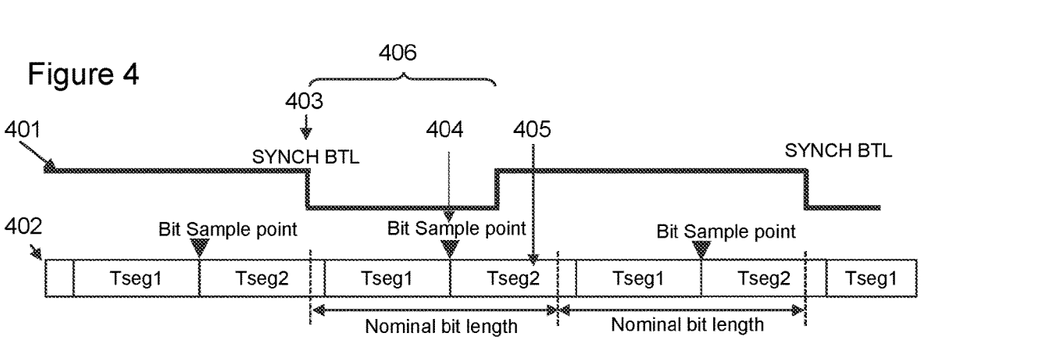
FIG. 4 shows an example sampling of asymmetrical signals, as in the state of the art in classical CAN and CAN FD.

FIG. 4 shows the sampling of asymmetrical signals as performed in the state of the art, such as in classical CAN and CAN FD. The sampling may be performed by an entity termed a bit timing logic block or BTL block.

Trace 401 shows an asymmetric bit stream (RXD). The asymmetric bit stream may comprise a "worst case single ended RXD". This may mean that this is the most asymmetric bit stream that may be tolerated in classical CAN and CAN FD. Section 402 shows the operation of a conventional "falling edge synchronized bit timing logic block" which is configured to determine the presence of logic high and logic low in the bit stream.

Section 402 shows the expected bit lengths synchronized to the last synchronization falling edge, with each bit time divided into segments Tseg1 and Tseg2 (and a SynchSeg, as will be known to those skilled in the art but not shown for simplicity). A falling edge is shown at 403 and therefore the nominal bit length runs from this point. The falling edge 403 falls within the unshown SynchSeg segment. Section 402 shows the timing of the conventional "falling edge synchronized bit timing logic block" wherein the bit sample point 404 is set to approximately 50% of the nominal bit time from the expected start of the bit, wherein the expected start of the bit is based on the last falling edge 403 synchronization. As can be seen, the sample point 404 is between the Tseg1 and Tseg2 sections and the sample time is just within the asymmetric bit time 406.

If the bit sample point 404 were at 70% of the nominal bit time from the expected start of the bit, as shown at 405, the conventional sampling mechanism may miss the asymmetric logic low bit 406 altogether.

Figure 5:
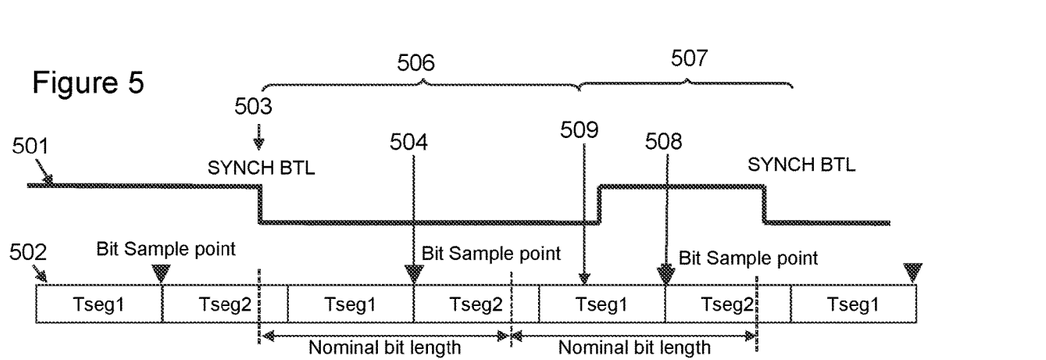
FIG. 5 shows a further example sampling of asymmetrical signals, as in the state of the art in classical CAN and CAN FD.

FIG. 5 shows the sampling of asymmetrical signals as performed in the state of the art, such as in classical CAN and CAN FD.

Trace 501 shows an asymmetric bit stream. The asymmetric bit stream may comprise a "worst case single ended RXD". This may mean that this is the most asymmetric bit stream that may be tolerated in classical CAN and CAN FD. Section 502 shows the operation of a conventional "falling edge synchronized bit timing logic block" which is configured to determine the presence of logic high and logic low in the bit stream.

Section 402 shows the expected bit lengths synchronized to the last synchronization bit, with each bit time divided into segments Tseg1 and Tseg2. A falling edge is shown at 503 and therefore the nominal bit length should run from this point. Section 502 shows the timing of the conventional "falling edge synchronized bit timing logic block" wherein the bit sample point 504 is set to 50% of the nominal bit time from the expected start of the bit, wherein the expected start of the bit is based on the last falling edge synchronization. As can be seen, the sample point is between the Tseg1 and Tseg2 sections and the sample time is within the asymmetric bit time 506.

With the bit sample point at 504, the bit timing logic block may be able to correctly determine the state of the bit 506 because bit 506 is long due to the asymmetry. However, the next bit 507 is short and the conventional sampling mechanism may place the next bit sampling point 508 at a point, such as at 509, that may miss the asymmetrically short, logic high bit 507 altogether.

Thus, using the conventional CAN/CAN FD sampling mechanism based on a fixed bit sample point 404, 504, 508 for each bit level a signal asymmetry of up to 50% of the bit time can be tolerated. As shown in FIGS. 4 and 5, based on a falling edge, a BTL is synchronized and determines, after 50% of the bit time, what the actual bit level is.

In the case the asymmetry gets bigger than about 50%, the bit sample points are not correct anymore and the received bit stream gets corrupted.

Figure 6:
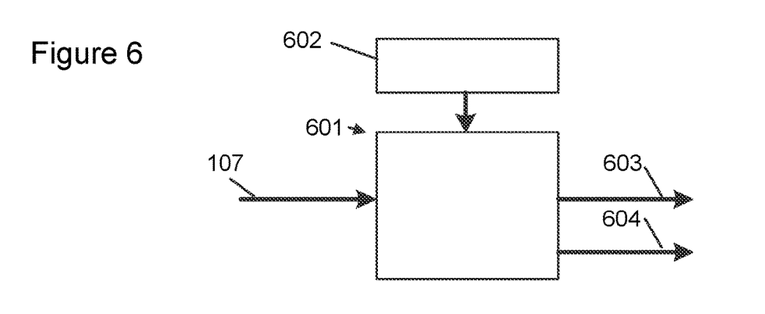
FIG. 6 shows a state of the art implementation for determining the values of bits in a bit stream in classical CAN and CAN FD.

FIG. 6 shows an example of how this classical CAN and CAN FD approach may be implemented. There is a single bit timing logic block (BTL) 601 that receives the bit stream from the receive input 107, also known as RXD. Thus, the BTL 601 comprises part of the CAN controller 101 and the bitstream is received from the CAN transceiver 103. The BTL 601 is triggered on a single edge and it provides the bit level of the bit stream based on the configured bit sample point. Thus, as shown in FIGS. 4 and 5, one of the falling edges initiates a timer, which in the above examples measures a time comprises 50% of the bit time for each subsequent bit using an oscillator 602, before the bits of the bit stream are sampled. The derived bit level based on this sampling is provided at "derived bit level" output 603. In addition, the BTL 601 provides the information on whether the next bit is provided, at the "next bit trigger" output 604.

We will now describe an example embodiment.

Instead of using just the recessive to dominant edge for re-synchronization only, it is proposed to use both edges in the CAN XL data phase since in the CAN XL data phase the physical layer makes sure that both bit transitions have the equal performance (Push Pull driver—see the description of the transmitter elements above). In contrast, classical CAN does not have such property. CAN FD comes pretty close to that property in examples in which the CAN FD Transceivers have Signal Improvement Capability (SIC). It will be appreciated that SIC is defined in a publicly available standard from CiA (CAN in Automation) through the CiA601-4 specification and CAN FD is an ISO standard: ISO11898-1 (Protocol) and ISO 11898-2 (Transceiver). The push pull driver and signal improvement capability may provide for at least a transmitter arrangement 108 in which the transmitter arrangement is configured to actively drive the bus between the first differential voltage state and the second differential voltage state and vice versa. As mentioned above, the transmitter arrangement 108 may include respective transmitter elements configured to drive the bus to the first and second differential states.

Furthermore, it is proposed to sample the RXD bus signal in a different way using a kind of post processing of the observed RXD bit pattern. Actually, the information of bit change on the bus is available through the observation that the level on the RXD line, i.e. at receive input 107, has changed from one level to the other level. If there is a signal change of reasonable time (e.g. that persists for a reasonable threshold time to filter out spikes of noise), then there is a bit level change on the bus lines. In case the receive input pin 107 toggles back to the other level, this is again already the information, that there is another bit present on the bus. For proper message reception it is not of relevance at what absolute moment in time a bit level change is discovered, it is about the right order of bits to be re-constructed. So, the bit falling edge may happen at any time relative to the rising edge and with that, the symmetry of the bits is not relevant anymore.

So, with reading the edge information instead of a certain level at a fixed moment in time (e.g. at a time point 50% of the bit time in from the expected start of a bit) the NRZ coded bit pattern can be re-constructed by judging from "edge to edge". In case there is no further edge within one nominal bit time, this represents another bit with the same level.

Thus, we disclose a controller area network, CAN, controller configured to receive a bit stream at a receive input RXD, the receive input comprising part of a receive path from a CAN transceiver that is coupled to the CAN bus to said CAN controller, the CAN controller comprising a CAN sampling mechanism, which may have application in the proposed CAN XL standard, wherein the CAN sampling mechanism or "apparatus" is configured to:

detect falling edges in said bit stream
detect, separately, rising edges in said bit stream; and
restore the non-return-to-zero coded bit stream based on said detected falling edges and said detected rising edges.

The bit stream received at the receive input 107 may be subject to the asymmetries discussed above. Therefore, in one or more examples, the disclosed CAN sampling mechanism, which is based on determining both falling edges and rising edges is configured to restore the bit stream by accurately determining the presence of a logic high or logic low state based on the detection of a rising edge to determine a logic high and a falling edge to determine a logic low. This technique may overcome the problems associated with the traditional way of sampling the bitstream in classic CAN in which falling edges define a synchronization point and a predetermined fraction of a nominal bit time is used to determine a sampling time point in which the level of the bit is captured. In classic CAN, it is the level in the bit stream at the sampling time point that determines whether the bit is determined to be logic high or logic low.

In particular, the CAN controller may be configured to restore the bit stream in the sense of sampling it in a way to overcome the effects of the asymmetry, and wherein the restored bitstream can be provided for further processing by the controller module 123 of the CAN controller 101, such as by a CAN protocol controller.

In one or more examples, when determining the logic high/logic low status of a bit using rising and falling edges, it may be possible for signal spikes caused by noise to erroneously cause the determination of a logic high/logic low bit because said spikes may appear as a rising edge followed rapidly by a falling edge or a falling edge followed rapidly by a rising edge.

Figure 7:
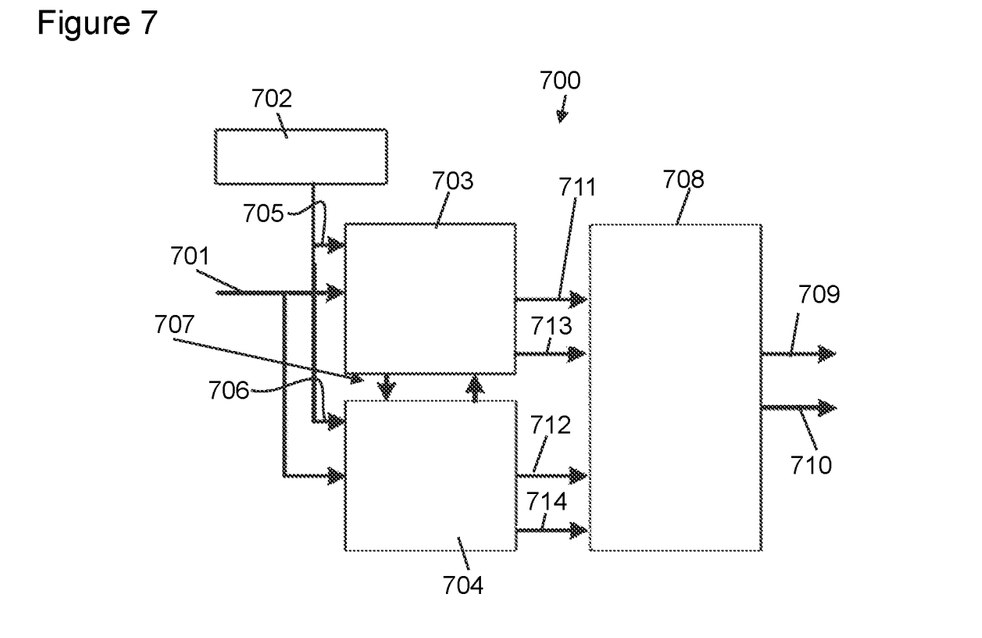
FIG. 7 shows an example embodiment of an apparatus in which there are provided two independent mechanisms for detecting edges and reconstructing the order of the bit stream.

Thus, in one or more examples, the CAN sampling mechanism may alternatively or in addition, use oversampling (for example, two samples in a row or more) to reject noise of very fast edges in a row, at minimum it uses single samples to detect edge transitions. The amount of multiple edges may be programmable to define the filter characteristics rejecting noise pulses. Thus, the CAN sampling mechanism may be configured to sample the bit stream at the receive input 107 at a rate twice or more the nominal bit time. In other examples, the CAN sampling mechanism may be configured to sample the bit stream one or more further times after detecting an edge to provide for rejection of noise. Thus, if a rising edge is detected, the sampling mechanism may be configured to sample the bitstream a predetermined time later, within a nominal bit time, and if logic low is detected it may be determined that the rising edge was noise. Alternatively, if a rising edge is detected and then logic high is determined by said one or more further samples, it may be determined that the rising edge was a valid bus state. Similarly, if a falling edge is detected, the sampling mechanism may be configured to sample the bitstream a predetermined time later, within a nominal bit time, and if logic high is detected it may be determined that the falling edge was noise. Alternatively, if a falling edge is detected and then logic low is determined by said one or more further samples, it may be determined that the falling edge was a valid bus state. As an example, the apparatus (BTL 703 and 704 in the figures that follow) are configured to "oversample" by taking individual level samples faster than a bit time 304, 305. A typical oversampling rate may comprise ten samples per bit but 5 to 15 samples per bit or any other range are possible. This may be user configurable. So, use of two samples in a row may be explained with the following example: the apparatus may detect an edge if the first (of the e.g. 10 samples per bit time) is HIGH and the next one is LOW. A noise pulse would, in such a situation, immediately be seen as an edge signifying a bit, which might be too sharp/fast on a noisy bus. Therefore, the apparatus may be configured to use "n" samples in a row before you consider the edge to be representative of a bit. As an example, with single sample edge detection the sample stream 111101111 this would be a logic level 1 0 1 bit pattern, because the judgment is made on single samples. The same sample pattern would result in no bit change if the apparatus uses e.g. 2 samples in a row to indicate a true signal edge. Thus, the apparatus may confirm through the subsequent oversampled samples that an edge really was an edge and not noise. For example, if it is decided that two samples in a row of the same logic state are required to confirm the edge is not noise, then this sample pattern would result in a bit detection, 1111001111 but a single zero would now be treated as "noise" and ignored.

Thus, in summary, in order to have some noise filtering, the decision of a proper edge may be based on a mechanism of accepting only two or more identical samples in a row. At minimum any different sample value is taken as an edge information (or optionally multiple identical samples in a row). The number of samples in a row for edge detection may be configurable. The more samples are taken, the longer a level change needs to maintain in order to detect a bit and with that, the range of tolerable Asymmetry goes down. It is a trade-off between noise rejection and asymmetry tolerance.

In one or more examples, the CAN sampling mechanism may include a first edge monitor or "BTL" configured to provide said detection of the falling edges and a second edge monitor or "BTL" configured to provide for detection of the rising edges.

In one or more examples, the CAN sampling mechanism receives a timing signal from a local oscillator. It will be appreciated that the timing signal from one node may be different or drift away from the timing signal of another node 100, 201, 202, 203 in the network.

Thus, the CAN sampling mechanism may be configured to synchronizes both the first edge monitor and the second edge monitor based on detection of a respective rising or falling edge on one of said first and second edge monitors. Actually, if a falling edge is detected, both edge detectors are correcting their bit timing with the same amount of time shift to compensate for oscillator tolerances between the sending and the receiving node.

Thus, if the first edge monitor detects a falling edge that occurs at a time that is not an integer multiple of the bit time, determined with reference to the local oscillator, then the first edge monitor determines that the local oscillator is not in synchronisation with the transmitting node of the network. The first edge monitor may then provide for synchronisation of both the first edge monitor and the second edge monitor by configuring the controller such that time between said falling edges is an integer multiple of the bit time. This may be achieved in different ways. For example, the first and second edge monitors may be configured such that the number of oscillations of the local oscillator that comprises a bit time may be adjusted. Alternatively, the frequency of the local oscillator may be adjusted. The skilled person will be aware of ways to provide said synchronization.

It will be appreciated that the CAN controller may comprise a CAN FD controller, said CAN FD controller comprising a CAN controller that implements the CAN FD protocol. The CAN FD controller includes a phase known in the art as a "fast data phase". Said CAN FD controller may implement the same sampling mechanism described herein on the bit stream at the receive input (i.e. on the RXD line) during said fast data phase.

Thus, for implementation it is proposed to oversample the incoming RXD bit stream compared to the sampling performed currently in classic CAN and CAN FD. The difference in the proposed sampling mechanism is that the discovered signal transition is taken as a bit level change already. Thus, it is the bit transition itself that the CAN controller uses to determine the value of a bit rather than using the bit transition as a start point for a timer, which then causes the sampling of the bit stream at a predetermined bit sample point (which may be based on 50% of the nominal bit time).

An example embodiment is also described with reference to FIGS. 7 and 8. An example CAN sampling mechanism or apparatus 700, that may be implemented in a CAN controller 101, is presented.

The apparatus 700 comprises an input node 701 to receive the bitstream from the RXD pin, namely the receive input 107, which receives the bitstream from the CAN transceiver 103. It will be appreciated that the CAN transceiver 103 is configured to receive the differential signal from the CAN bus 202 and provide a single digital signal to the receive input 107. The CAN transceiver 103 is not configured to interpret the differential signaling and may be considered to act as a level shifter based on the differential signaling. Accordingly, any asymmetry in the signaling from the bus 202 will be present in the bitstream received at 107 and therefore at input node 701.

The apparatus 700 comprises a first bit timing logic module ("BTL") 703 and a second bit timing logic module 704. The first BTL 703 is configured to detect rising edges in the bitstream from the input 701. The second BTL 704 is configured to detect falling edges in the bitstream from input 701. The first and second BTL also include a clock input 705 and 706 to receive a timing signal from a local oscillator 702.

A bidirectional connection 707 is provided between the first and second BTL 703,704 to provide synchronisation information therebetween for synchronization of both BTLs based on the determination of the need for synchronization by one of them.

The apparatus 700 also includes a BTL selector 708 which is configured to receive an edge detect signal 711 from the first BTL 703 and an edge detect signal 712 from the second BTL 704. The edge detect signals 711, 712 may be used to determine the logic high or logic low levels of the bitstream. The selector 708 is also configured to receive a bit elapsed signal 713 from the first BTL 703 and a bit elapsed signal 714 from the second BTL 704. The bit elapsed signal may be configured to signal that a bit time or integer multiple thereof has elapsed since the last rising or falling edge.

Said first block 703 and said second block 704 are configured to receive a clock signal from the oscillator 702 and wherein said predetermined bit time, used to determine when to provide the bit elapsed signal is defined by a number of cycles of said oscillator.

Thus, in this and other examples, the signal transitions in the bit stream are monitored by BTLs 703, 704 comprising independent hardware blocks. The BTLs are synchronized to the detected edges. One BTL synchronizes to the falling edges, the other one to the rising edges. Whenever a BTL 703, 704 discovers a time deviation between e.g. two falling edges or two rising edges (It will be understood that regardless of asymmetry in the bitstream, each similar edge can happen only after a nominal bit time or integer multiple of said nominal bit time), this is treated as an oscillator tolerance problem and the BTLs gets re-synchronized. With that the apparatus provides double the accuracy and that budget may be used for higher clock tolerance or less stuff bits in the protocol.

In case an edge is detected by one BTL 703, 704 (and is proven to be a valid edge by the optional multiple samples with same level), this transition is determined to be a received bit and is taken as a valid protocol bit. From now onwards the other BTL 703, 704 takes over and looks for a transition back to the other bit level. In case there is no transition back to the other level within a reasonable time (actually measured in nominal expected bit lengths), there is a second bit discovered with the same level in a row and the apparatus takes this as another valid bit level. This process continues, until the next edge is discovered.

With that mechanism any asymmetry in the duty cycle can be decoded back to the original NRZ bit stream as long as the edges are still detectable. This improves the allowable signal degradation on the path from the transmitting node to the receiving node, massively allowing for much higher robustness against tolerances in the system.

Thus, an asymmetric bit stream may be received at input 701. At the next edge in the bit stream, either the first BTL 703 will detect a rising edge or the second BTL 704 will detect a falling edge. Subject to any additional sampling to remove noise, the detection of the rising edge by the first BTL 703 will provide for the edge detect signaling 711 to the BTL selector 708 indicative of a logic high being received. Likewise, and subject to any additional sampling to remove noise, the detection of the falling edge by the second BTL 704 will provide for the edge detect signaling 712 to the BTL selector 708 indicative of a logic low being received. One or both of the BTLs 703, 704 will also each provide the bit elapsed signaling 713, 714 to the selector 708 each time an integer multiple of the nominal bit time elapses based on the timing signal from the oscillator 702 and synchronization information stored by the BTLs for translating a number of oscillations of the oscillator to the bit time.

Further, each of the first and second BTLs 703 and 704 are determining the time difference between consecutive rising edges with respect to the first BTL 703 and consecutive falling edges with respect to the second BTL 704. It will be appreciated that given the cause of any asymmetry in the network will likely affect the consecutive rising edges or the consecutive falling edges in the same way, then the time difference should be a multiple of the bit time defined by the protocol. If the first and second BTL 703,704 determine that the time difference between the consecutive rising edges or the time difference between the consecutive falling edges is not an integer multiple of the bit time, then it is determined that the local oscillator 702 has drifted or is, at least, operating with different timing to the local oscillator of the transmitting node 100, 201, 202, 203 of the network. Thus, the first BTL 703 and/or the second BTL 704 may determine a synchronization or correction to be applied such that the bit time determined using the local oscillator 702 matches the bit time of the incoming bitstream. For example, the BTLs may be configured to determine the bit time based on a predetermined number of oscillations of the oscillator. If it is determined that the bit time is slower than the sending node, the predetermined number of oscillations may be reduced. Alternatively, if it is determined that the bit time determined by the BTL is faster than the sending node, the predetermined number of oscillations may be increased. In this way the selector 708 receives signaling indicating the presence of logic high or logic low in the bitstream based on the edges detected by the respective first and second BTLs 703, 704 as well as said bit elapsed signaling indicative of the bit time, which is maintained in synchronisation with the sending node using the time difference between rising edges and the time difference between falling edges.

The selector 708 may therefore be configured to reconstruct an NRZ bitstream without said asymmetry. The selector 708 may therefore be configured to provide derived bit level at output 709 comprising logic high or logic low and a next bit trigger signal at output 710 providing the information regarding the elapse of a bit time. Thus, for the case that there are multiple bits with the same level in a row, the signal at output 709 would not change, and the information that there is now another bit with the same level received is provided by the signal at 710. So, output 710 may be configured to output e.g. a pulse whenever the BTLs 703, 704 have determined the elapse of a completed bit time; that is either the first BTL 703 (if that one is active) of the second BTL 704 if that one is actively searching for an edge. Thus, in one or more examples, once one BTL detects an edge the other of the BTLs may then become active looking for the next edge. The "active" status of the BTLs may be provided by the exchange of signaling at 707. So, the signal at 710 "triggers" with e.g. a pulse, that a bit has been found, while the signal at output 709 is providing information on whether the found bit is a logic 1 or a logic 0.

It will be appreciated that other example embodiments may be provided. For example, the first and second BTLs may be logical blocks of a signal processing element rather than separate hardware blocks.

To summarise, in the proposed CAN XL specification, it is disclosed to split the BTL (see FIG. 6: 601) into two independent engines (see FIG. 7: 703, 704), each providing the next bit level based on their detected edges. It is proposed to use two BTL blocks 703,704 configured to search for bit transitions. With that, the bit stream can be re-constructed even at higher asymmetries than 50%.

Furthermore, the apparatus 700 can provide information that a full nominal bit time has elapsed according to their detected edges. After detection of the edge, a post processing takes the information from the two BTL blocks 703, 704 and generates the according bit pattern at the output 709, 710. It will be appreciated that the output 709 and the trigger signal at output 710 are time aligned with both the rising and falling edges as determined by the first and second BTLs. This selector 708 may comprise a multiplexor selecting the output of a respective BLT based on the detected edges and generating the trigger of the next bit based on the elapsed bit time based on the bit elapsed signal from each respective first and second BTL 703, 704.

It should be noted, that the received bit stream does not provide nominal bit length and it is not needed to do so. The apparatus 700 is able to provide for reconstruction of the correct bit order.

Depending on the time between two similar edges determined by the first and second BTL blocks 703, 704 it can be discovered whether there are multiple bits in a row with the same bit level since similar edges can only occur after full bit periods. If there are more full bit periods with no level change, a simple counter can be used to define how many bits with a similar level are discovered. The bit elapsed signal between the BTLs 703 and 704 and the selector 708 may provide this information.

With this approach, asymmetries can be tolerated as big as the remaining level changes can be detected with the over sampling rate.

Figure 8:
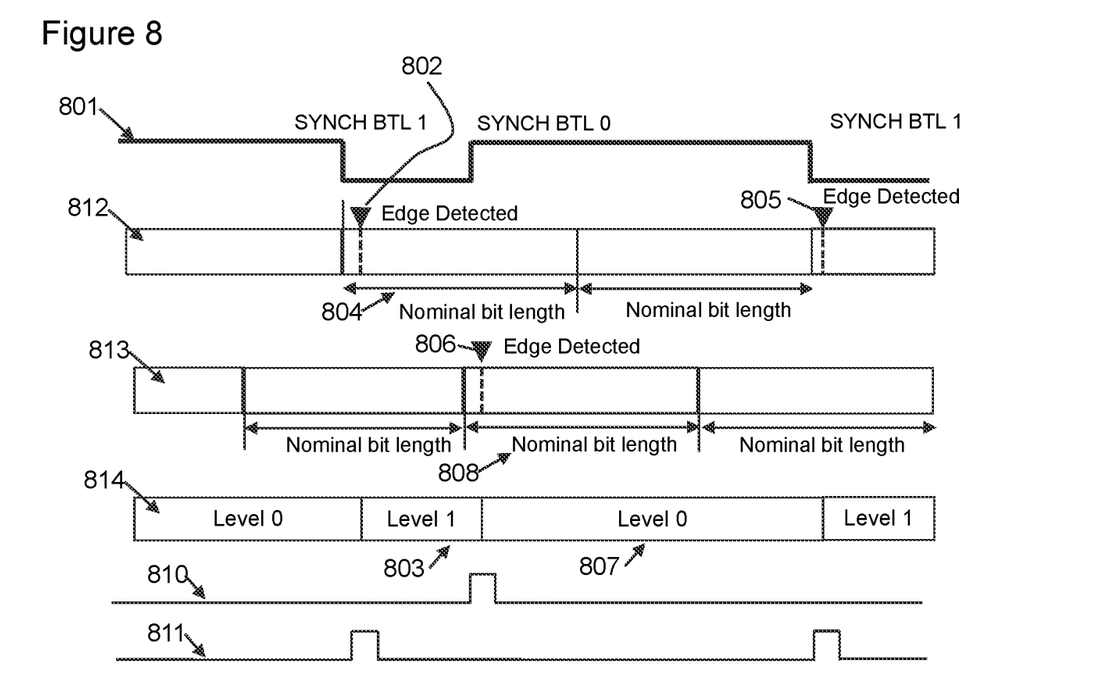
FIG. 8 shows an example embodiment of an edge-based bit pattern recovery mechanism for implementation in a CAN controller of a CAN node of a CAN network.

FIG. 8 shows a first asymmetric bit stream 801, which may be termed "Worst case single ended RXD". At time 802, the second block 704 detects a falling edge and therefore provides its edge detect signal at 803. The nominal bit length time or "length" 804 is determined based on the time between said "first" falling edge and a consecutive "second" falling edge shown at 805.

At time 806, the first block 703 detects a rising edge and therefore provides its edge detect signal at 807. The nominal bit length 808 is determined between said "first" rising edge 806 and a consecutive "second" rising edge not visible in FIG. 8.

As mentioned above, the nominal bit length comprises an integer multiple of the time difference between 802 and 805 (i.e. 2× nominal bit length). The calculated nominal bit time or length may then be used to calibrate the apparatus 700 so that the predetermined bit time determined from the oscillator signal 702, corresponds to the calculated nominal bit length.

Trace 812 may be termed "Falling edge Synchronized BTL Delivering "Level 1 Bits"" showing the action of one of the BTLs 703,704. Trace 813 may be termed "Rising edge Synchronized BTL Delivering "Level 0 Bits"" showing the action of the other of the BTLs 703,704. Trace 814 may be termed "Correct Received Bit Stream".

The bit elapsed signal 713 is shown in trace 810 and the bit elapsed signal 714 is shown in trace 811.

Figure 9:
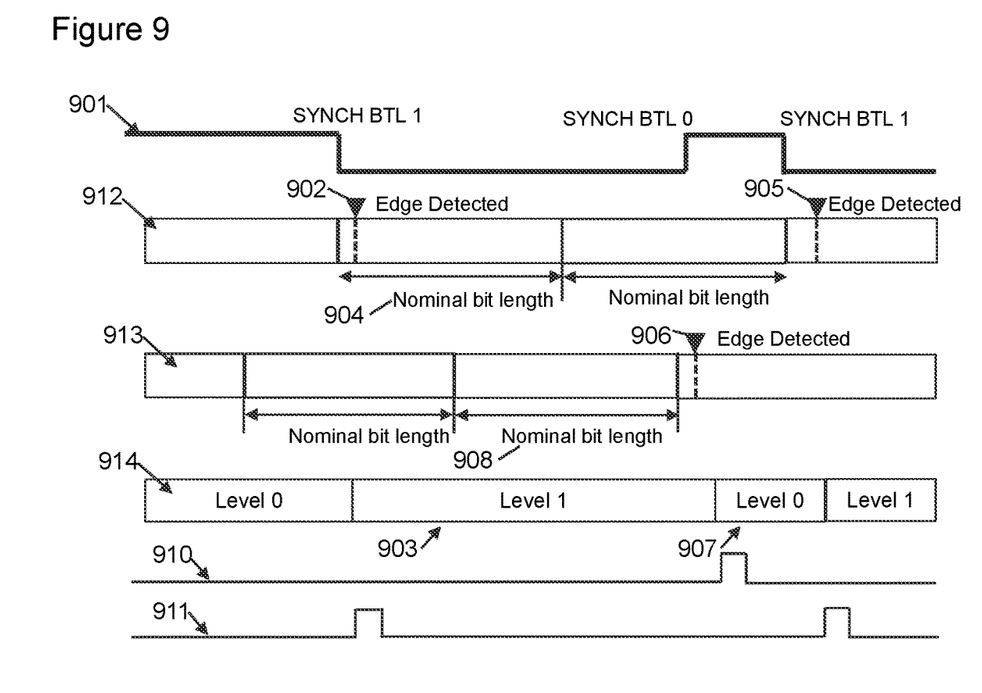
FIG. 9 shows a second example embodiment of an edge-based bit pattern recovery mechanism for implementation in a CAN controller of a CAN node of a CAN network.

FIG. 9 shows a second asymmetric bit stream 901. At time 902, the second block 704 detects a falling edge and therefore provides its edge detect signal at 903. The nominal bit time or "length" 904 is determined between said "first" falling edge 902 and a consecutive "second" falling edge shown at 905.

At time 906, the first block 703 detects a rising edge and therefore provides its edge detect signal at 907. The nominal bit time or length 908 is determined between said "first" rising edge 906 and a directly adjacent "second" rising edge not visible in FIG. 9.

The bit elapsed signal 713 is shown in trace 910 and the bit elapsed signal 714 is shown in trace 911.

As mentioned above, the nominal bit length comprises an integer multiple of the time difference between 902 and 905 (i.e. 2× nominal bit length). The calculated nominal bit length may then be used to calibrate the apparatus 700 so that the predetermined bit time determined from the oscillator signal 702, corresponds to the calculated nominal bit time or length.

Trace 912 may be termed "Falling edge Synchronized BTL Delivering "Level 1 Bits"" showing the action of one of the BTLs 703,704. Trace 913 may be termed "Rising edge Synchronized BTL Delivering "Level 0 Bits"" showing the action of the other of the BTLs 703,704. Trace 914 may be termed "Correct Received Bit Stream".

Figure 10:
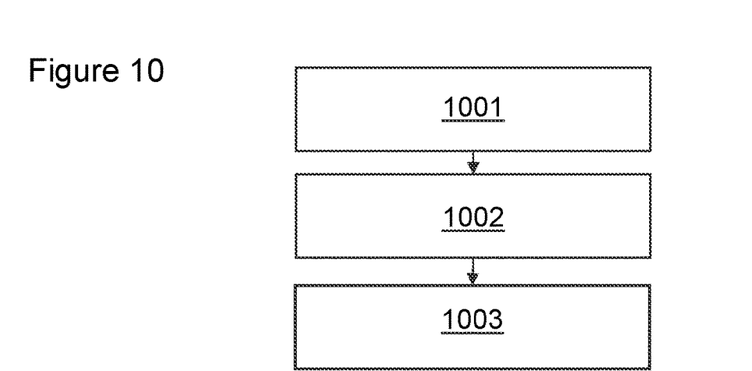
FIG. 10 shows an example method performed by the apparatus.

FIG. 10 shows an example method of generating a bit stream from a received, e.g. asymmetric, bit stream in a CAN controller. The method comprises determining a logic low state of said bit stream based on detection of a falling edge 1001. The method comprises determining a logic high state based on detection of a rising edge 1002. The method comprises determining 1003 the time between successive rising edges and determining the time between successive falling edges to determine the nominal bit length of the received bit stream 1003, the determined nominal bit length used to update a predetermined bit time stored by the apparatus 700, such as in each BTL. The predetermined bit time may be used to determine when consecutive logic highs are present in the bit stream or consecutive logic lows are present in the bit stream. The predetermined bit time may be used to provide timing for bits in a transmit mode.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

It will be appreciated that the terms logic high and logic low are used in a generally to refer to different logic states signified by the rising and falling edges of a bitstream, however, the logic state signified by edges may be arbitrarily assigned. Thus, more generally, the terms first logic state and second logic state may be used.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A Controller Area Network (CAN) bit stream apparatus for a CAN controller, the apparatus configured to:
   receive an incoming bit stream from a CAN transceiver;
   detect rising edges in the incoming bit stream;
   detect, separately, falling edges in the incoming bit stream; and
   generate a restored non-return-to-zero coded bit stream based at least on said detected falling edges and said detected rising edges;
   wherein generating the restored non-return-to zero coded bit stream based at least on said detected falling edges and said detected rising edges comprises:
      generating a first logic state bit in said restored non-return-to-zero coded bit stream in response to detecting a first rising edge in the incoming bit stream;
      generating a second logic state bit in said restored non-return-to-zero coded bit stream in response to detecting a first falling edge in the incoming bit stream;
      generating a further first logic state bit in said restored non-return-to-zero coded bit stream subsequent to said first logic state bit following the detection of the first rising edge and prior to detection of a directly subsequent edge based on the elapse of a predetermined bit time; and
      generating a further second logic state bit in said restored non-return-to-zero coded bit stream subsequent to said second logic state bit following the detection of the first falling edge and prior to detection of a directly subsequent edge based on the elapse of the predetermined bit time.

2. The CAN bit stream apparatus of claim 1, further comprising:
   a first block configured to provide for said detection of said rising edges in the incoming bit stream;
   a second block configured to provide for said detection of said falling edges in the incoming bit stream; and
   a selector block configured to provide for generation of the restored non-return-to-zero coded bit stream based on said detection of the rising edges and falling edges in the incoming bit stream by said first block and said second block;

wherein detection of a rising edge by the first block provides for generation of the first logic state bit and the further first logic state bit in said restored non-return-to-zero coded bit stream, and detection of a falling edge by the second block provides for generation of the second logic state bit and the further second logic state bit in said restored non-return-to-zero coded bit stream.

3. The CAN bit stream apparatus of claim 2, wherein said first block is configured to provide an edge detect signal on detection of a rising edge to the selector block to instruct the selector block to generate the first logic state bit in the restored non-return-to-zero coded bit stream and the first block is configured to provide a bit elapsed signal after each predetermined bit time that follows to enable the selector block to generate one or more subsequent first logic state bits in the restored non-return-to-zero coded bit stream; and wherein said second block is configured to provide an edge detect signal on detection of a falling edge to the selector block to instruct the selector block to generate the second logic state bit in the restored non-return-to-zero coded bit stream and the second block is configured to provide a bit elapsed signal after each predetermined bit time that follows to enable the selector block to generate one or more subsequent second logic state bits in the restored non-return-to-zero coded bit stream.

4. The CAN bit stream apparatus of claim 2, wherein said first block and said second block are configured to determine a nominal bit time of the incoming bit stream, said nominal bit time comprising the time for which a bit is transmitted by a transmitting node that transmits the incoming bit stream, wherein said first block is configured to determine said nominal bit time based on a determined first block time between rising edges of the incoming bit stream, and said second block is configured to determine said nominal bit time based on a determined second block time between falling edges of the incoming bit stream, wherein said first block time and said second block time are indicative of an integer multiple of the nominal bit time of the incoming bit stream; and said first block and/or said second block are configured to provide for modification of said predetermined bit time based on said determined nominal bit time.

5. The CAN bit stream apparatus of claim 4, wherein said first block time comprises the time between consecutive rising edges.

6. The CAN bit stream apparatus of claim 4, wherein said second block time comprises the time between consecutive falling edges.

7. The CAN bit stream apparatus of claim 2, wherein said first block and said second block are configured to receive a clock signal from an oscillator and wherein said predetermined bit time is defined by a number of cycles of said oscillator.

8. The CAN bit stream apparatus of claim 1, wherein the apparatus is configured to reject noise in the incoming bit stream by oversampling the incoming bit stream and detecting a rising edge based on a change in logic state to the first logic state between two samples and said first logic state being maintained in at least a third sample, consecutive with said first and said second sample, and detecting a falling edge based on a change in logic state to the second logic between two samples and said second logic state being maintained in at least a third sample, consecutive with said first and said second sample.

9. The CAN bit stream apparatus of claim 1, wherein the apparatus is configured to use oversampling on the incoming bit stream to reject noise, said oversampling comprising sampling the bit stream using at least two consecutive samples, wherein based on a rising or falling edge determined by said first sample and the other of a rising or falling edge determined by said second sample, the determined edges in the bit stream are rejected as noise, wherein said samples are taken with a time spacing less than a predetermined bit time.

10. The CAN bit stream apparatus of claim 3, wherein the first block is configured to, on detection of a rising edge, provide a synchronization signal to the second block to define a time point from which the elapse of the predetermined time period is determined; and wherein the second block is configured to, on detection of a falling edge, provide a synchronization signal to the first block to define a time point from which the elapse of the predetermined time period is determined.

11. A CAN controller including the CAN bit stream apparatus of claim 1.

12. A CAN network including a plurality of nodes, wherein at least one of said nodes includes the CAN controller of claim 11.

13. A method of processing a bit stream in a Controller Area Network (CAN) controller, the method comprising:
receiving an incoming bit stream from a CAN transceiver;
detecting rising edges in the incoming bit stream;
detecting, separately, falling edges in the incoming bit stream; and
generating a restored non-return-to-zero coded bit stream based at least on said detected falling edges and said detected rising edges;
wherein said detecting a rising edge provides for a first logic state in said generating of the restored non-return-to-zero coded bit stream;
wherein said detecting a falling edge provides for a second logic state in said generating of the restored non-return-to-zero coded bit stream;
wherein the method includes determining a nominal bit time, said nominal bit time comprising the time for which a bit is transmitted by a transmitting node that transmits the incoming bit stream,
wherein said nominal bit time is for use as the bit length of the restored non-return-to-zero coded bit stream, said determination of the nominal bit time based on a determined time between consecutive rising edges of the incoming bit stream and based on a determined time between consecutive falling edges of the incoming bit stream.

14. A method of processing a bit stream in a Controller Area Network (CAN) controller, the method comprising:
receiving an incoming bit stream from a CAN transceiver;
detecting rising edges in the incoming bit stream;
detecting falling edges in the incoming bit stream; and
generating a restored non-return-to-zero coded bit stream based at least on said detected falling edges and said detected rising edges by:
generating a first logic state bit in said restored non-return-to-zero coded bit stream in response to detecting a first rising edge in the incoming bit stream;

generating a second logic state bit in said restored non-return-to-zero coded bit stream in response to detecting a first falling edge in the incoming bit stream;

generating a further first logic state bit in said restored non-return-to-zero coded bit stream subsequent to said first logic state bit following the detection of the first rising edge and prior to detection of a directly subsequent edge based on the elapse of a predetermined bit time; and generating a further second logic state bit in said restored non-return-to-zero coded bit stream subsequent to said second logic state bit following the detection of the first falling edge and prior to detection of a directly subsequent edge based on the elapse of the predetermined bit time.

\* \* \* \* \*